United States Patent
Inoue et al.

(10) Patent No.: US 6,246,149 B1
(45) Date of Patent: Jun. 12, 2001

(54) SURFACE ACOUSTIC WAVE DEVICE

(75) Inventors: Kenji Inoue; Katsuo Sato; Hiroki Morikoshi; Katsumi Kawasaki; Kiyoshi Uchida, all of Tokyo (JP)

(73) Assignee: TDK Corporaton, Tokyo (JP)

( * ) Notice: Subject to any disclaimer, the term of this patent is extended or adjusted under 35 U.S.C. 154(b) by 0 days.

(21) Appl. No.: 09/395,103

(22) Filed: Sep. 14, 1999

(30) Foreign Application Priority Data

Sep. 14, 1998 (JP) .................................................. 10-260509
Dec. 10, 1998 (JP) .................................................. 10-351656

(51) Int. Cl.$^7$ .................................................. H01L 41/04
(52) U.S. Cl. .......................................................... 310/313 A
(58) Field of Search ............................... 310/313 A, 360

(56) References Cited

U.S. PATENT DOCUMENTS 5,917,265    6/1999   Naumenko et al. ............. 310/313 A

FOREIGN PATENT DOCUMENTS

WO 97/25776    7/1997   (WO) .

OTHER PUBLICATIONS

Takeda et al, Synthesis and Characterization of Sr3TaGa3Si2O14 Single Crystals, 35 Mat. Res. Bull. 245–252 (Jan. 2000).*

"Numerical and Experimental Investigation Saw in Langasite", Yakovkin et al., 1995 IEEE Ultrasonics Symposium. pp. 389–392.

"Modified Rare–Earth Gallates with a $Ca_3 Ga_2 Ge_4 O_{14}$ Structure", B.V. Mill, et al., 1982 Sov. Phys. Dokl. 27(6), Jun. 1982, pp. 434–437.

Journal of Japanese Association for Crystal Growth, vol. 25, No. 3, 1998 (Catalog No. 14aA7).

* cited by examiner

Primary Examiner—Nestor Ramirez
Assistant Examiner—Peter Medley
(74) Attorney, Agent, or Firm—Frishauf, Holtz, Goodman, Langer & Chick, P.C.

(57) ABSTRACT

A surface acoustic wave device has a piezoelectric substrate whose properties include electromechanical coupling coefficient advantageous to widening passband width and SAW velocity advantageous to achieving a compact surface acoustic wave device. The piezoelectric substrate is composed of the single crystal represented by chemical formula $Sr_3TaGa_3Si_2O_{14}$ belonging to point group 32. For example, cut angle of the single crystal and propagation direction of the surface acoustic wave are in region 1-1, wherein said region 1-1 represented by Euler angles ($\phi$, $\theta$, $\psi$) satisfies $\phi=25°$ ~35°, $\theta=20°$ ~90°, $\psi=-40°$ ~40°. These angles may be in range 1-2, wherein said range 1-2 satisfies $\phi=25°$ ~35°, $\theta=20°$ ~90°, $\psi=-25°$ ~25°.

5 Claims, 6 Drawing Sheets

FIG. 1

| Mark | Composition | Cut Angle | Propagation Direction | SAW velocity (m/s) | $k^2$(%) |
|---|---|---|---|---|---|
| 128LN | LiNbO3 | rotated Y at 128 degree | X | 3992 | 5.5 |
| 64LN | LiNbO3 | rotated Y at 64 degree | X | 4742 | 11.3 |
| 36LT | LiTaO3 | rotated Y at 36 degree | X | 4212 | 4.7 |
| LT112 | LiTaO3 | X | rotated Y at 112 degree | 3288 | 0.64 |
| ST quartz | quartz | ST | X | 3158 | 0.14 |

FIG. 3

| φ (°) | θ (°) | ψ (°) | SAW velocity(m/s) | coupling coefficient(%) |
|---|---|---|---|---|
| 30 | 30 | −60 | 3019 | 0.16 |
| 30 | 30 | −45 | 2994 | 0.21 |
| 30 | 30 | −30 | 2942 | 0.15 |
| 30 | 30 | −15 | 2933 | 0.43 |
| 30 | 30 | 0 | 2919 | 0.50 |
| 30 | 30 | 15 | 2893 | 0.32 |
| 30 | 30 | 30 | 2882 | 0.13 |
| 30 | 30 | 45 | 2903 | 0.15 |
| 30 | 30 | 60 | 2948 | 0.28 |
| 30 | 60 | −60 | 2971 | 0.07 |
| 30 | 60 | −45 | 2905 | 0.15 |
| 30 | 60 | −30 | 2847 | 0.28 |
| 30 | 60 | −15 | 2822 | 0.49 |
| 30 | 60 | 0 | 2826 | 0.57 |
| 30 | 60 | 15 | 2845 | 0.44 |
| 30 | 60 | 30 | 2882 | 0.25 |
| 30 | 60 | 45 | 2933 | 0.15 |
| 30 | 60 | 60 | 2982 | 0.13 |
| 30 | 90 | −60 | 2948 | 0.02 |
| 30 | 90 | −45 | 2869 | 0.11 |
| 30 | 90 | −30 | 2808 | 0.29 |
| 30 | 90 | −15 | 2779 | 0.49 |
| 30 | 90 | 0 | 2788 | 0.58 |
| 30 | 90 | 15 | 2830 | 0.50 |
| 30 | 90 | 30 | 2897 | 0.30 |
| 30 | 90 | 45 | 2973 | 0.12 |
| 30 | 90 | 60 | 3039 | 0.02 |

FIG. 4

| $\phi$ (°) | $\theta$ (°) | $\psi$ (°) | SAW velocity(m/s) | coupling coefficient(%) |
|---|---|---|---|---|
| 0 | 20 | 15 | 2990 | 0.33 |
| 0 | 20 | 30 | 2991 | 0.38 |
| 0 | 20 | 45 | 2963 | 0.27 |
| 0 | 20 | 60 | 2935 | 0.06 |
| 0 | 20 | 75 | 2948 | 0.09 |
| 0 | 30 | 0 | 2923 | 0.19 |
| 0 | 30 | 15 | 2954 | 0.41 |
| 0 | 30 | 30 | 2970 | 0.43 |
| 0 | 30 | 45 | 2966 | 0.29 |
| 0 | 30 | 60 | 2957 | 0.08 |
| 0 | 30 | 75 | 2967 | 0.05 |
| 0 | 60 | 0 | 2817 | 0.49 |
| 0 | 60 | 15 | 2845 | 0.50 |
| 0 | 60 | 30 | 2902 | 0.41 |
| 0 | 60 | 45 | 2961 | 0.24 |
| 0 | 60 | 60 | 3016 | 0.11 |
| 0 | 60 | 75 | 3058 | 0.03 |
| 0 | 90 | 0 | 2767 | 0.55 |
| 0 | 90 | 15 | 2790 | 0.50 |
| 0 | 90 | 30 | 2844 | 0.35 |
| 0 | 90 | 45 | 2913 | 0.18 |
| 0 | 90 | 60 | 2985 | 0.06 |
| 0 | 90 | 75 | 3046 | 0.01 |
| 0 | 120 | 0 | 2783 | 0.39 |
| 0 | 120 | 15 | 2800 | 0.40 |
| 0 | 120 | 30 | 2841 | 0.38 |
| 0 | 120 | 45 | 2889 | 0.24 |
| 0 | 120 | 60 | 2946 | 0.08 |
| 0 | 120 | 75 | 3000 | 0.01 |
| 0 | 150 | 0 | 2844 | 0.16 |
| 0 | 150 | 15 | 2864 | 0.26 |
| 0 | 150 | 30 | 2908 | 0.41 |
| 0 | 150 | 45 | 2949 | 0.31 |
| 0 | 150 | 60 | 2989 | 0.09 |
| 0 | 150 | 75 | 3029 | 0.04 |
| 0 | 160 | 0 | 2871 | 0.10 |
| 0 | 160 | 15 | 2895 | 0.23 |
| 0 | 160 | 30 | 2945 | 0.38 |
| 0 | 160 | 45 | 2973 | 0.14 |
| 0 | 160 | 75 | 3034 | 0.12 |

SURFACE ACOUSTIC WAVE DEVICE

FIELD OF THE INVENTION

The present invention relates to a surface acoustic wave device having an interdigital electrode disposed on a piezoelectric substrate.

BACKGROUND OF THE INVENTION

Recently, mobile communication terminals, including a portable phone, have come into wide use. From the viewpoint of their portability, it is one of essential factors required to the terminals to be compact and lightweight.

Each electronic element employed in the terminal is also needed to be compact and lightweight to achieve a compact, lightweight terminal. A surface acoustic wave device advantageous for coping with the above requirement, so called a surface acoustic wave filter, has been broadly used for a filter in an intermediate or high frequency circuit of the terminal.

The surface acoustic wave device has a piezoelectric substrate and an interdigital electrode formed on a main surface of the piezoelectric substrate in order to excite, receive, reflect and propagate a surface acoustic wave.

One of important material properties of the piezoelectric substrate used for the surface acoustic wave device is surface wave velocity of the surface acoustic wave (SAW velocity). Two others are temperature coefficient of center frequency in case of its being used for a filter or of resonance frequency in case of its being used for a resonator (TCF), and electromechanical coupling coefficient ($k^2$).

FIG. 1 shows a table listed each composition of prior piezoelectric substrates generally used for the surface acoustic wave device. The prior piezoelectric substrates shown in FIG. 1 are generally classified into two groups. One group includes 128LN, 64LN and 36LT having electromechanical coupling coefficient and another group includes LT112 and ST quartz having small electromechanical coupling coefficient. 128LN, 64LN and 36LT, which is the piezoelectric substrate having high SAW velocity and high electromechanical coupling coefficient, are applied to the surface acoustic wave filter in the high frequency circuit of the terminal. LT112 and ST quartz, which is the piezoelectric substrate having low SAW velocity and small electromechanical coupling coefficient, are applied to the surface acoustic wave filter in the intermediate frequency circuit of the terminal. The reason for their applications is that the center frequency of the surface acoustic wave filter is directly proportional to the SAW velocity of the applied piezoelectric substrate and is inversely proportional to the electrode finger width of the interdigital electrode formed on the piezoelectric substrate.

Therefore, the substrate having high SAW velocity is suitable for the filter applied to the high frequency circuit. The filter applied to the high frequency circuit of the terminal needs the substrate having high SAW velocity and also high electromechanical coupling coefficient. Because the terminal requires the wideband filter having the passband width of more than 20 MHz.

On one hand, the frequency band ranging from 70 to 300 MHz is used for intermediate frequencies in the mobile terminal. In case that the surface acoustic wave device is used for the filter having the center frequency within the above frequency band, it needs to increase the electrode finger width formed on the substrate in proportion to lowering value of the center frequency considerably compared with that of the filter in the high frequency circuit. This causes a problem that the size of surface acoustic wave device itself becomes large. Therefore, LT112 or ST quartz having low SAW velocity if generally applied to the surface acoustic wave filter in the intermediate frequency circuit. In particular, ST quartz is a suitable material for the piezoelectric substrate due to its zero first order temperature coefficient of frequency. ST quartz can be applied only to the filter having narrow passband due to its property being small electromechanical coupling coefficient. However, up to this time, the above property has hardly caused any problem because the filter in the intermediate frequency circuit has performed only to have one narrow channel signal passed through.

In recent years, in order to used frequency resource effectively and adapt for a digital data communication, a digital mobile communication system has been developed, has been practically established and is also intensively coming into wide use. The digital mobile communication system needs extreme wide passband width ranging from several hundred KHz to several MHz. In case that the surface acoustic wave device is applied to the intermediate frequency filter requiring such wide bandwidth, it is impossible to make an adequate substrate of ST quartz. Furthermore, the mounting area of the surface acoustic filter for intermediate frequency is needed to be smaller in order to achieve a smaller mobile terminal having high portability. Through ST quartz and LT112 are recognized as suitable substrates applied to the surface acoustic filter for intermediate frequency, they can hardly contribute to make the substrate smaller due to the fact that their SAW velocity is over 3000 m/sec.

SUMMARY OF THE INVENTION

It is the object of the present invention to provide a surface acoustic wave device used a piezoelectric substrate having high electromechanical coupling coefficient effective to widen passband width and also low SAW velocity effective to make the surface acoustic wave device smaller.

This object is achieved as follows. The piezoelectric substrate of the present invention used the single crystal represented by chemical formula of $Sr_3TaGa_3Si_2O_{14}$ belonging to point group 32. This material is one of substituted piezoelectric substrates having the langasite-type structure developed in Russia, referred as new substituted langasite-type piezoelectric substrates by Tomohiko Kato, etc. in [Journal of Japanese Association for Crystal Growth, Vol. 25, No. 3, 1998 (Catalog No. 14aA7)]. Inventors of the present invention have investigated this crystal. In result, it has been found that desirable piezoelectric substrate properties for surface acoustic wave devices can be obtained in case that crystal cut angle and propagation direction of the surface acoustic wave are in predetermined region, and finally the present invention have been applied for.

According to the first embodiment of the present invention, the crystal cut angle of the substrate and the propagation direction of the surface acoustic wave are in region 1-1 represented by Euler angles ($\phi$, $\theta$, $\psi$) with $\phi=25°$ ~35°, $\theta=20°$ ~90°, $\psi=-40°$ ~40°. In the second embodiment, these angles are in region 1-2 with $\phi=25°$ ~35°, $\theta=20°$ ~90°, $\psi=-25°$ ~25°. In the third embodiment, these angles are in region 2-1 with $\phi=-5°$ ~5°, $\theta=10°$ ~170°, $\psi=0°$ ~50°. In the fourth embodiment, these angles are in region 2-2 with $\phi=-5°$ ~5°, $\theta=25°$ ~120°, $\psi=0°$ ~30°. In the fifth embodiment, these angles are in region 2-3 with $\phi=-5°$ ~5°, $\theta=130°$ ~160°, $\psi=15°$ ~45°.

The crystal substrate having the above mentioned angles in region 1-1 provides the SAW velocity of under 3000 m/sec, which is lower than that of ST quartz, and also provides the sufficiently high electromechanical coupling coefficient of over 0.2%. The crystal substrate having the angles in region 1–2 provides the SAW velocity of under 3000 m/sec and also provides the electromechanical coupling coefficient of over 0.4%. The crystal substrate having the angles in region 2-1 provides the SAW velocity of under 3000 m/sec and also provides the electromechanical coupling coefficient of over 0.2% as same as the properties in region 1-1. The crystal substrate having the angles in region 2-2 and 2–3 provides the SAW velocity of under 3000 m/sec and also provides the electromechanical coupling coefficient of over 0.4% as same as the properties in region 1–2.

The fact that the single crystal of $Sr_3TaGa_3Si_2O_{14}$ is three-dimensional crystal and has symmetrical crystal structure so that arrangements of equivalent Euler angles are provided. For instance, the Euler angle ($\phi$, $\theta$, $\psi$) arrangement of (30°, 90°, 0°) in region 1-1 is equivalent with the arrangement of (90°, 90°, 0°). The angle ($\phi$, $\theta$, $\psi$) arrangement of (0°, 90°, 17°) included in region 2-1 is equivalent with the arrangements of (0°, 90°, −17°), (60°, 90°, ±17°) or (120°, 90°, ±17°). Furthermore, the arrangement of (0°, 90°, 17°) included in the region 2-1 is equivalent with the arrangements of (240°, 90°, ±17°) or (360°, 90°, ±17°). Therefore, it is to be understood that every equivalent Euler angle arrangements based on symmetrical structural characteristic are included within the scope of the present invention.

BRIEF DESCRIPTION OF THE DRAWING

FIG. 1 is a table showing prior piezoelectric substrates used for surface acoustic wave devices and their properties.

FIG. 3 is a table showing properties of piezoelectric substrates used for surface acoustic wave devises according to the present invention.

FIG. 4 is a table showing properties of another embodiment of piezoelectric substrates used for surface acoustic wave devices according to the present invention.

DESCRIPTION OF THE PREFERRED EMBODIMENT

Figure 2:
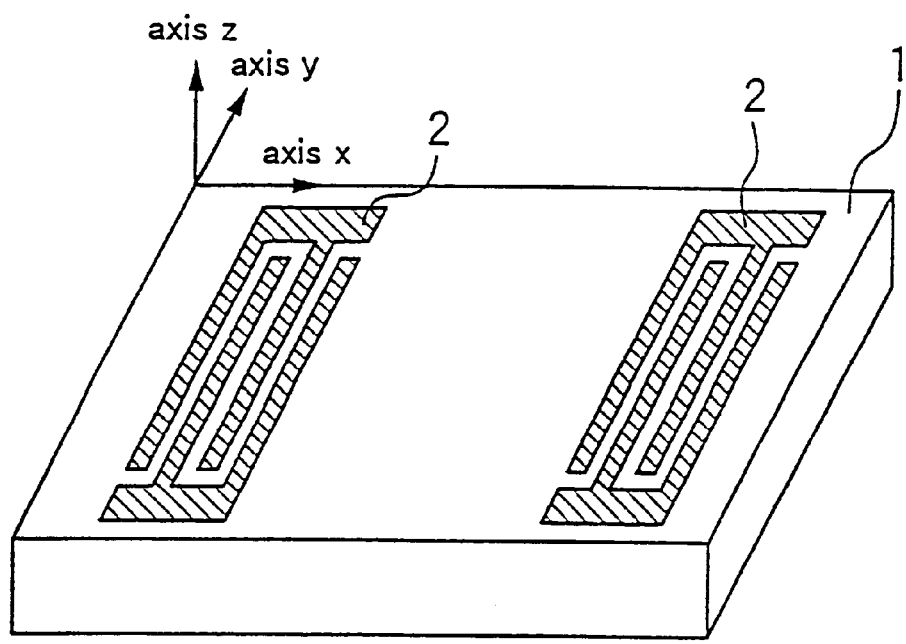
FIG. 2 is a perspective view illustrating one embodiment of a surface acoustic wave devise according to the present invention.

Hereinafter, preferred embodiments of the present invention are explained with reference to the drawings. FIG. 2 shows one embodiment of the present invention used for surface acoustic wave devices. A pair of interdigital electrodes 2 is disposed on one main surface of piezoelectric substrate 1. Any known configuration, number and arrangement can be applied to interdigital electrodes 2.

Piezoelectric substrate 1 of the present invention is composed of the single crystal represented by chemical formula of $Sr_3TaGa_3Si_2O_{14}$ belonging to point group 32. The single crystal material may include oxygen defects and inevitable impurities such as Al, Zr, Fe, Ce, Nd, La, Pt and Ca.

The crystallographic axes, which are axis X, axis Y and axis Z, of the single crystal are defined by the measuring method which is shown in the description on piezoelectric polarity test in page 333 of the publication entitled [The Acoustic Wave Device Technology Handbook] (editor: Japan Society for Promotion of Science, the surface acoustic wave technologies 150th committee; Ohmsha, Ltd., published date: Nov. 30, 1991). That is, the crystal belongs to point group 32 and its polarization axis is congruous with axis X in right-hand coordinate. The face azimuth of the prepared single crystal perpendicular to axis X is determined accurately under using the X-ray diffractometer and then the face is exposed by slicing the crystal into a thin plate, in result a measuring sample is prepared. The sample plate is set on and in parallel with a copper plate connected with minus terminal of the oscilloscope. Then tip of a probe connected with plus terminal of the oscilloscope is pressed against the sample plate surface strongly so that potential difference is caused by the piezoelectric effect. Polarity of the sample plate surface can be judged without forming electrodes. However, it is advantageous to the judgement that electrodes are formed on upper and lower sides of the sample plate to obtain high electric potential. The polarity of the sample plate surface is judged from the following steps. The voltage waveform is observed by the oscilloscope, and then the crystal surface pressed by the probe defines +surface and the reverse crystal surface defines −surface in case that the first waveform peak is in positive voltage. Reversely, the crystal surface pressed by the probe defines −surface and the reverse crystal surface defines +surface in case that the first waveform peak is in negative voltage. The direction directed from the −surface to the +surface toward perpendicular line of the +surface determined by the above definition defines +X direction in the right-hand coordinate. Determining axis +X, axis +Y and axis +Z are determined theoretically due to the right-hand coordinate.

In FIG. 2, axis x, axis y and axis z are crossed with right angle each other. Axis x and axis y are in the surface of substrate 1. Axis x defines propagation direction of the surface acoustic wave. Axis z is perpendicular to the substrate 1 surface and defines cut angle or cut surface of the single crystal substrate. The relationship between axis x, y, z and crystallographic axis X, Y, Z of the single crystal can be represented by Euler angles ($\phi$, $\theta$, $\psi$).

On piezoelectric substrate 1 for the surface acoustic wave devices according to the present invention, its cut angle represented by Euler angles ($\phi$, $\theta$, $\psi$) is in either of the above mentioned region 1-1, 1–2, 2-1, 2-2, 2–3 and their equivalent regions.

[Embodiment]

Piezoelectric substrate 1 for the surface acoustic wave devices is made of the single crystal represented by chemical formula $Sr_3TaGa_3Si_2O_{14}$ belonging to point group 32. The single crystal is grown by the CZ technique using high frequency induction heating, namely the rotation pulling-up technology. The compound made by mixing $SrCO_3$ of purity 99.99%, $Ta_2O_5$, $Ga_2O_3$ and $SiO_2$ oxide powder with stoichiometric ratio is used for a raw material. $N_2$ mixed with oxygen of 2 volume % is prepared for a growing atmosphere. Crystal rotation speed, pulling-up velocity and pulling-up azimuth are set at 5 rpm, 1.5 mm/h and 0 0 0 1) respectively. In result a single crystal of 52 mm in diameter is obtained.

A part of the crystal is crashed and then the crashed powder phase is identified by the X-ray diffractometer. Through this phase identification, it is verified that the crystal is single phase including no different phase. None of macroscopic defects, such as pore, crack and inclusion, exist and it is verified by ortho-scope images of the polarization microscope that the raw material has been grown into uniform single crystal. The obtained single crystal is sliced into a substrate, in result a substrate for the surface acoustic wave device is prepared.

After that, input and output interdigital electrodes 2 shown in FIG. 2 are formed on the surface of piezoelectric substrate 1 made from the above steps, in result a experimental surface acoustic wave device is prepared. For forming interdigital electrodes 2, Al film is formed on the substrate by means of vapor-deposition and then the photo-etching process is applied for configuring them. Wave period $\lambda$ of the electrode finger corresponding to wavelength of the surface acoustic waves is 60 $\mu$m, number of finger pair is 20 pairs, aperture width is 60 $\lambda$ (3600 $\mu$m) and film thickness is 0.3 $\mu$m. In FIG. 2, axis x is the propagation direction of the surface acoustic wave. Axis y is the direction perpendicular to the propagation direction of the surface acoustic wave. Axis z is the direction perpendicular to the substrate surface.

Figure 5:
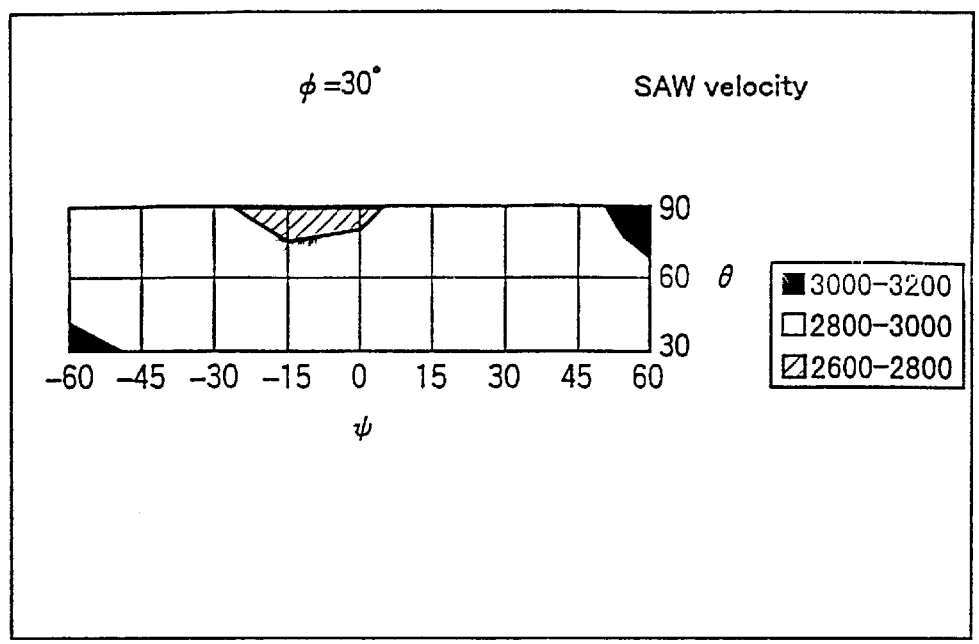
FIG. 5 is a diagram showing SAW velocities on piezoelectric substrates of the embodiment shown in FIG. 3.
Figure 6:
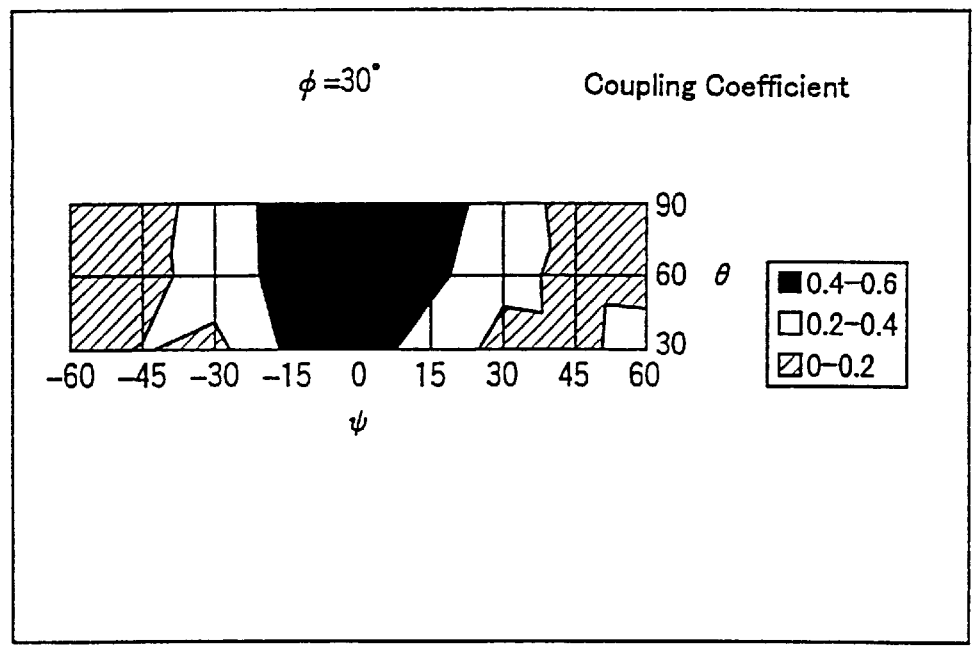
FIG. 6 is a diagram showing electromechanical coupling coefficients on piezoelectric substrates of the embodiment shown in FIG. 3.
Figure 7:
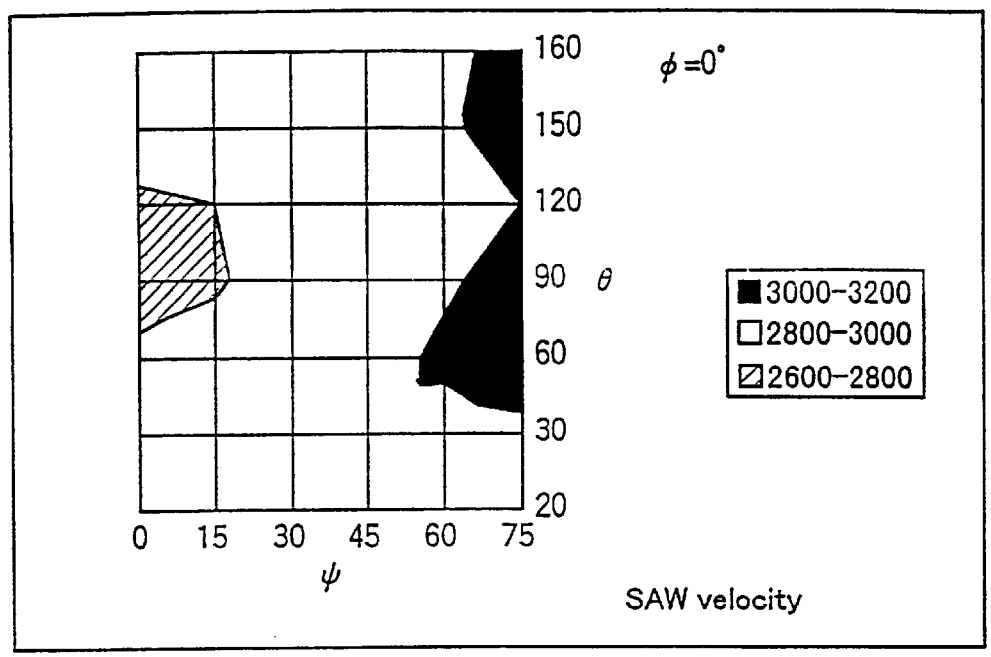
FIG. 7 is a diagram showing SAW velocities on piezoelectric substrates of the embodiment shown in FIG. 4.
Figure 8:
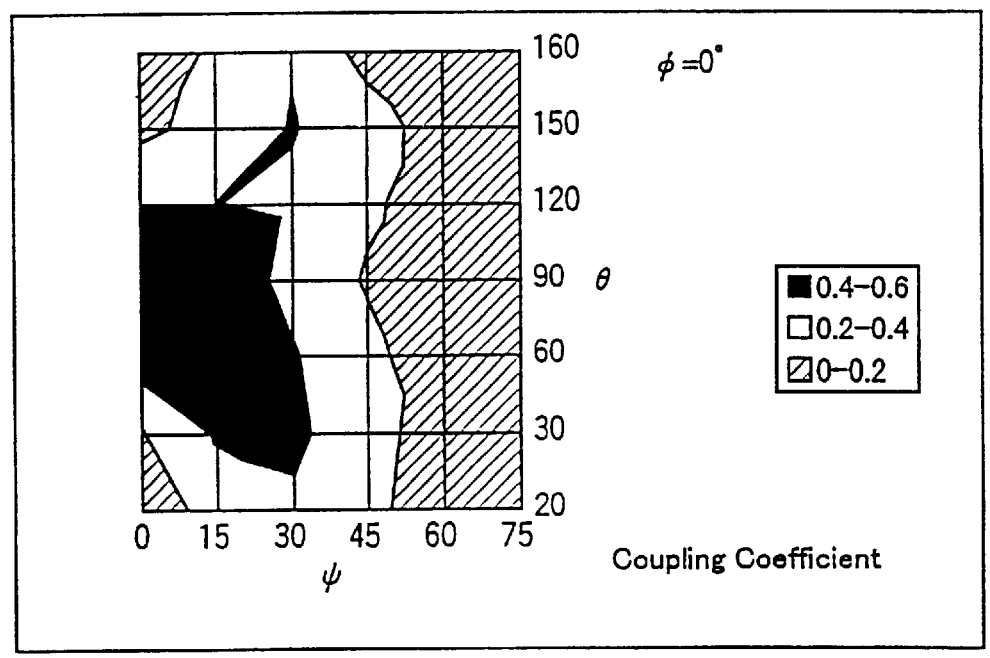
FIG. 8 is a diagram showing electromechanical coupling coefficients on piezoelectric substrates of the embodiment shown in FIG. 4.

Plural surface acoustic wave devices, whose cut angle of the substrate and propagation direction of the surface acoustic wave are varied, are prepared. SAW velocity and electromechanical coupling coefficient of each surface acoustic wave device are shown in FIG. 3 and FIG. 4. In FIG. 5 and FIG. 6, diagrams two-dimensionally shows SAW velocity and electromechanical coupling coefficient based on the data in FIG. 3 respectively. In FIG. 7 and FIG. 8, diagrams two-dimensionally shows SAW velocity and electromechanical coupling coefficient based on the data in FIG. 4 respectively. SAW velocity is determined by making a center frequency value, which is measured as filter property of the above mentioned interdigital electrode structure, multiplied by wavelength of the surface acoustic wave. Electromechanical coupling coefficient is determined by Smith equivalent circuit method using real part (conductance) and imaginary part (susceptance) of the admittance which is determined by measuring one of the input and output interdigital electrodes, for instance the input two-terminal admittance. This method is described in detail in the publication entitled [Surface Wave Devices and its applications] (editor: Electronic Materials Manufacturers Association of Japan. publisher: The Nikkan Kogyo Shimbun, Ltd. 1978), particularly in its Chapter 4.1.2 [The effective electromechanical coupling coefficient for surface waves] of ]. [Basic edition]. The above properties are measured in the ambient temperature of 25° C. surrounding the device.

FIG. 3, FIG. 5 and FIG. 6 clearly show the following results. In case that angle $\phi$ is 30°, angle $\theta$ is in 30° ~90° and angle $\psi$ is in −40° ~40°, electromechanical coupling coefficient is over 0.2% and SAW velocity is under 3000 m/sec. In case that angle $\phi$ is 30° ±5°, the same result may be obtained. Even if angle $\theta$ is decreased to 20°, the same result may also be obtained. In case that angle $\psi$ is in −25° ~25°, electromechanical coupling coefficient is over 0.4%.

FIG. 4, FIG. 7 and FIG. 8 show the following results. In case that angle $\phi$ is 0°, angle $\theta$ is in 20° ~160° and angle $\psi$ is in 0° ~50°, electromechanical coupling coefficient is over 0.2% and SAW velocity is under 3000 m/sec. In case that angle $\theta$ is in 10° ~170°, the same result may be obtained. In case that angle $\theta$ is in 25° ~120° and angle $\psi$ is in 0° ~30°, electromechanical coupling coefficient is further increased up to over 0.4%. In case that angle $\theta$ is in 130° ~160° and angle $\psi$ is in 15° ~45°, the same result may be obtained.

As described above, the present invention can provide a compact surface acoustic wave device with wide bandwidth.

What is claimed is:

1. A surface acoustic wave device having a piezoelectric substrate and a interdigital electrode disposed on one of main surfaces of the piezoelectric substrate, comprising:
   said piezoelectric substrate composed of single crystal represented by chemical formula $Sr_3TaGa_3Si_2O_{14}$ belonging to point group 32, and having predetermined cut angle of said single crystal and predetermined propagation direction of said surface acoustic wave,
   said predetermined cut angle of said single crystal and said predetermined propagation direction being in a region 1-1, wherein said region 1-1 represented by Euler angles ($\phi$, $\theta$, $\psi$) satisfies $\phi$=25° ~35°, $\theta$=20° ~90°, $\psi$=−40° ~40°.

2. A surface acoustic wave device having a piezoelectric substrate and a interdigital electrode disposed on one of main surfaces of the piezoelectric substrate comprising:
   said piezoelectric substrate composed of single crystal represented by chemical formula $Sr_3TaGa_3Si_2O_{14}$ belonging to point group 32, and having predetermined cut angle of said single crystal and predetermined propagation direction of said surface acoustic wave,
   said predetermined cut angle of said single crystal and said predetermined propagation direction being in a region 1–2, wherein said region 1–2 represented by Euler angles ($\phi$, $\theta$, $\psi$) satisfies $\phi$=25° ~35°, $\theta$=20° ~90°, $\psi$=−25° ~25°.

3. A surface acoustic wave device having a piezoelectric substrate and a interdigital electrode disposed on one of main surfaces of the piezoelectric substrate, comprising:
   said piezoelectric substrate composed of single crystal represented by chemical formula $Sr_3TaGa_3Si_2O_{14}$ belonging to point group 32, and having predetermined cut angle of said single crystal and predetermined propagation direction of said surface acoustic wave,
   said predetermined cut angle of said single crystal and said predetermined propagation direction being in a region 2-1, wherein said region 2-1 represented by Euler angles ($\phi$, $\theta$, $\psi$) satisfies $\phi$=−5° ~5°, $\theta$=10° ~170°, $\psi$=0° ~50°.

4. A surface acoustic wave device having a piezoelectric substrate and an interdigital electrode disposed on one of main surfaces of the piezoelectric substrate, comprising:
   said piezoelectric substrate composed of single crystal represented by chemical formula $Sr_3TaGa_3Si_2O_{14}$ belonging to point group 32, and having predetermined cut angle of said single crystal and predetermined propagation direction of said surface acoustic wave,
   said predetermined cut angle of said single crystal and said predetermined propagation direction being in region 2-2, wherein said region 2-2 represented by Euler angles ($\phi$, $\theta$, $\psi$) satisfies $\phi$=−5° ~5°, $\theta$=25° ~120°, $\psi$=0° ~30°.

5. A surface acoustic wave device having a piezoelectric substrate and a interdigital electrode disposed on one of main surfaces of the piezoelectric substrate comprising:
   said piezoelectric substrate composed of single crystal represented by chemical formula $Sr_3TaGa_3Si_2O_{14}$ belonging to point group 32, and having predetermined cut angle of said single crystal and predetermined propagation direction of said surface acoustic wave,
   said predetermined cut angle of said single crystal and said predetermined propagation direction being in region 2–3, wherein said region 2–3 represented by Euler angles ($\phi$, $\theta$, $\psi$) satisfies $\phi$=−5° ~5°, $\theta$=130° ~160°, $\psi$=15° ~45°.

* * * * *